(12) United States Patent
Okazaki

(10) Patent No.: US 6,744,100 B2
(45) Date of Patent: Jun. 1, 2004

(54) SEMICONDUCTOR APPARATUS WITH IMPROVED ESD WITHSTANDING VOLTAGE

(75) Inventor: Miho Okazaki, Osaka (JP)

(73) Assignee: Ricoh Company, Ltd. (JP)

( * ) Notice: Subject to any disclaimer, the term of this patent is extended or adjusted under 35 U.S.C. 154(b) by 0 days.

(21) Appl. No.: 10/363,226

(22) PCT Filed: Jul. 12, 2002

(86) PCT No.: PCT/JP02/07126
§ 371 (c)(1),
(2), (4) Date: Mar. 6, 2003

(87) PCT Pub. No.: WO03/007380
PCT Pub. Date: Jan. 23, 2003

(65) Prior Publication Data
US 2003/0183843 A1 Oct. 2, 2003

(30) Foreign Application Priority Data
Jul. 13, 2001 (JP) ........................................ 2001-214111

(51) Int. Cl.⁷ .............................................. H01L 23/62
(52) U.S. Cl. ........................................ 257/360; 257/355
(58) Field of Search .................................. 257/355, 360

(56) References Cited

U.S. PATENT DOCUMENTS

| | | | |
|---|---|---|---|
| 4,994,874 A | 2/1991 | Shimizu et al. | |
| 5,449,940 A * | 9/1995 | Hirata | 257/360 |
| 5,473,182 A | 12/1995 | Kumagai | |
| 5,909,046 A | 6/1999 | Tanizaki et al. | |
| 5,932,914 A * | 8/1999 | Horiguchi | 257/355 |
| 6,078,068 A * | 6/2000 | Tamura | 257/203 |
| 6,455,898 B1 * | 9/2002 | Liu et al. | 257/360 |

FOREIGN PATENT DOCUMENTS

| | | |
|---|---|---|
| GB | 2 259 606 | 3/1993 |
| JP | 6-112422 | 4/1994 |
| JP | 8-37299 | 2/1996 |
| JP | 8-236637 | 9/1996 |
| JP | 8-288404 | 11/1996 |
| JP | 9-186296 | 7/1997 |
| JP | 11-121750 | 4/1999 |
| JP | 2000-164807 | 6/2000 |
| JP | 2001-44374 | 2/2001 |

* cited by examiner

*Primary Examiner*—Allan R. Wilson
(74) *Attorney, Agent, or Firm*—Dickstein Shapiro Morin & Oshinsky LLP

(57) ABSTRACT

A semiconductor apparatus having an outer ESD protective circuit corresponding to each external connection terminal, the outer ESD protective circuit being formed in a peripheral region around the external connection terminals. The outer ESD protective circuit discharges electrostatic voltage from the external connection terminal and avoids the damaging of an internal circuit of the semiconductor apparatus. Accordingly, the ESD withstanding voltage of the semiconductor apparatus is improved.

8 Claims, 10 Drawing Sheets

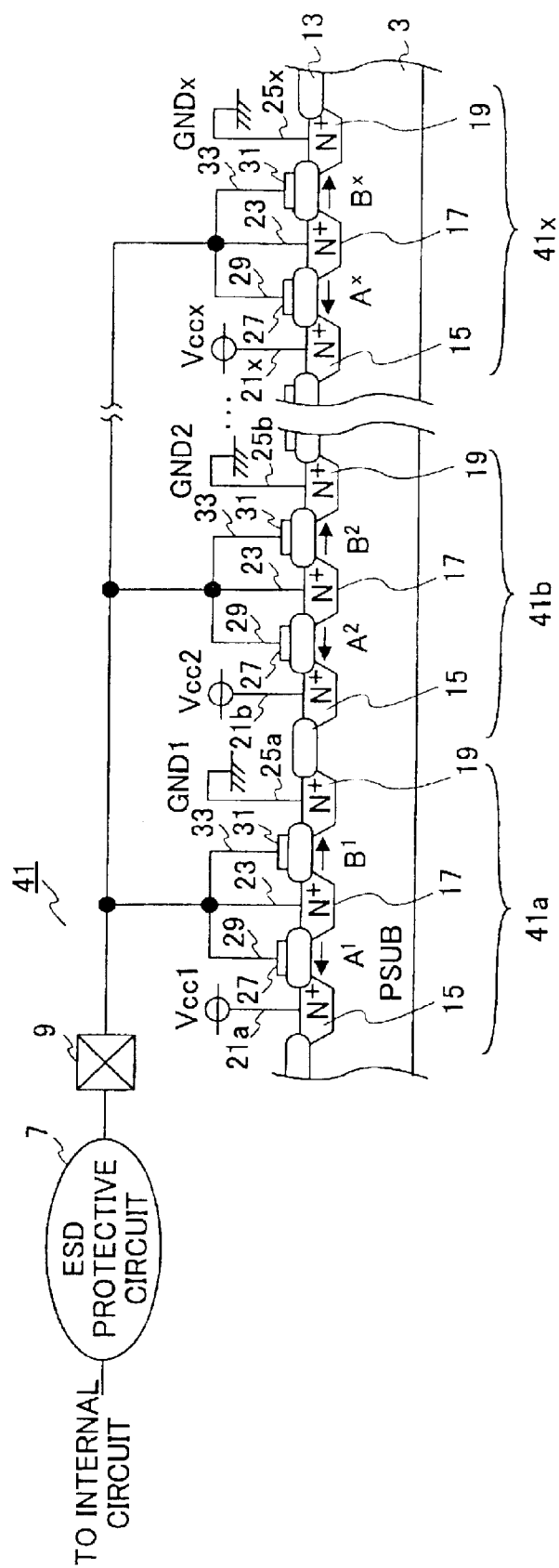

(prior art)

US 6,744,100 B2

SEMICONDUCTOR APPARATUS WITH IMPROVED ESD WITHSTANDING VOLTAGE

TECHNICAL FIELD

The present invention generally relates to a semiconductor apparatus, and more particularly, to a semiconductor apparatus that is provided with an internal circuit in the central portion of a semiconductor chip and a plurality of external connection terminals in the peripheral portion of the semiconductor chip, wherein a plurality of different voltage levels are provided to the plurality of external connection terminals, and further provided is an electrostatic discharge (ESD) protective circuit to prevent the semiconductor apparatus from being damaged by ESD.

BACKGROUND ART

FIG. 9 is a block diagram showing a conventional semiconductor apparatus provided with an ESD protective circuit.

An analog functional block 105a and a digital functional block 105d are formed in an internal circuit 105 formed on a semiconductor substrate. The analog functional block 105a and the digital functional block 105d are electrically connected to each other via an interface 111. An analog voltage AVcc as a power supply voltage and an analog ground AGND are electrically connected to the analog functional block 105a. A digital voltage DVcc as a power supply voltage and a digital ground DGND are electrically connected to the digital functional block 105d.

An analog pad 109a is electrically connected to the analog functional block 105a via the ESD protective circuit 107a. The analog power supply voltage AVcc and the analog ground AGND are electrically connected to the ESD protective circuit 107a.

A digital pad 109d is electrically connected to the digital functional block 105d via the ESD protective circuit 107d. The digital power supply voltage DVcc and the digital ground DGND are electrically connected to the ESD protective circuit 107d.

The ESD protective circuits 107a and 107d are composed of, for example, metal oxide semiconductor field effect transistors (MOSFETs) and diffusion resistors (for more details, refer to Japanese Laid-open Patent Applications 8-37299, 8-236637, 8-288404, and 9-186296).

FIG. 10 is a circuit diagram showing an equivalent circuit of the ESD protective circuit 107a.

The ESD protective circuit 107a is configured by a protective diode D1 formed by an N-channel type MOSFET, a protective diode D2 formed by an N-channel type MOSFET, and a diffusion resistor R.

The diffusion resistor R is provided on the signal line between a MOSFET that is a portion of the analog functional block 105a and the analog pad 109a. The source of the protective diode D1 is connected to the analog power supply voltage AVcc. The drain of the protective diode D1 and the drain of the protective diode D2 are connected to each other, and further connected to the signal line between a diffusion resistor 8b and the analog pad 109a. The gate electrode of the protective diode D1, the source of the protective diode D2, and the gate electrode of the protective diode D2 are grounded.

As the components of large scale integrated circuits (LSIs) become smaller, lightly doped drain (LDD) type MOSFETS, of which the ability to withstand ESD voltage is lower than that of single drain structured MOSFETs, are used more often than ever. Accordingly, it is getting more difficult to form protective components of the ESD protective circuit with only MOSFETs.

Further, since the integration scale of LSIs is getting greater, it is possible to form many system blocks on a single chip wherein many digital functional blocks and many analog functional blocks are disposed. In the case of a semiconductor apparatus provided with multiple digital functional blocks and multiple analog functional blocks, it is necessary for each functional block to have its own power supply in order to protect each functional block from the noise on common signal lines, for example, and to reduce power consumption of the entire LSI by using and managing multiple power supply voltages. Most of the multiple power supply voltages are generated external to the LSI and provided to the LSI through separate terminals of the LSI.

Further, in the case of a system LSI having an analog functional block, an exclusive power supply system is often used for the analog functional block, which requires a small-sized ESD protective circuit. Accordingly, it becomes obvious that the ESD withstanding voltage of such a system LSI becomes low.

Further, as showed in FIG. 9, in the case of an LSI having multiple power supply systems, if a large current needs to flow through the analog pad 109a, the electrostatic energy cannot be discharged by the ESD protective circuit 107a since the analog power supply AVcc and the analog ground AGND do not have enough capacity to let the current flow. The electrostatic energy may also be discharged through the digital power supply DVcc and/or the digital ground DGND. Thus, the internal circuit including the interface 111 electrically connecting the analog functional block and the digital functional block are damaged by the ESD.

DISCLOSURE OF INVENTION

Accordingly, it is an object of the present invention to provide a novel and useful semiconductor apparatus having multiple power supply systems of which ESD withstanding voltage is improved.

To achieve the above object, a semiconductor apparatus formed on a semiconductor substrate having a first conductivity type, according to the present invention includes an internal circuit in the central portion of a semiconductor substrate, a plurality of external connection terminals formed in a first portion of said semiconductor substrate around said internal circuit, each external connection terminal being electrically connected to said internal circuit, wherein a plurality of power supplies correspondingly supply different voltage levels to the plurality of external connection terminals, and a plurality of outer ESD protective circuits formed in a second portion of said semiconductor substrate or a common well region in said semiconductor substrate, around said first portion of said semiconductor substrate, wherein each of said outer ESD protective circuits further comprises a first diffusion region electrically connected to one of the external connection terminals, a second diffusion region formed separately from said first diffusion region, said second diffusion region being electrically connected to a higher voltage line of a main power supply, and a third diffusion region formed separately from said first diffusion region, at a side of said first diffusion region opposite from said second diffusion region, said third diffusion region being electrically connected to a lower voltage line of said main power supply.

The above main power supply refers to, among the multiple power supply systems, the power supply that supplies power to the largest portion of the internal circuit.

According to the present invention, the outer ESD protective circuit connected to the higher voltage line and the lower voltage line of the main power supply are disposed in a peripheral portion that is closer to the edge of the semiconductor chip than the external connection terminals. If electrostatic voltage is introduced through the external connection terminal, the electro static voltage is discharged through the outer ESD protective circuit so as not to damage the internal circuit. Accordingly the ESD withstanding voltage of the semiconductor apparatus is improved.

Further, the ESD protective circuit of this structure can be manufactured by ordinary manufacturing processes of semiconductor apparatuses without adding any special process.

Furthermore, since the ESD protective circuit transfers the electrostatic energy when the electrostatic voltage exceeds the withstanding voltage between two diffusion regions instead of electrical switching, the outer ESD protective circuit does not work under normal operating conditions. That is, the addition of the outer ESD protective circuit does not affect the operation of the internal circuit.

Other objects, features, and advantages of the present invention will become more apparent from the following detailed description when read in conjunction with the accompanying drawings.

BRIEF DESCRIPTION OF DRAWINGS

FIG. 4 is a cross-sectional view of a semiconductor chip provided with an ESD protective circuit according to the second embodiment of the present invention;

BEST MODE FOR CARRYING OUT THE INVENTION

Figure 1:
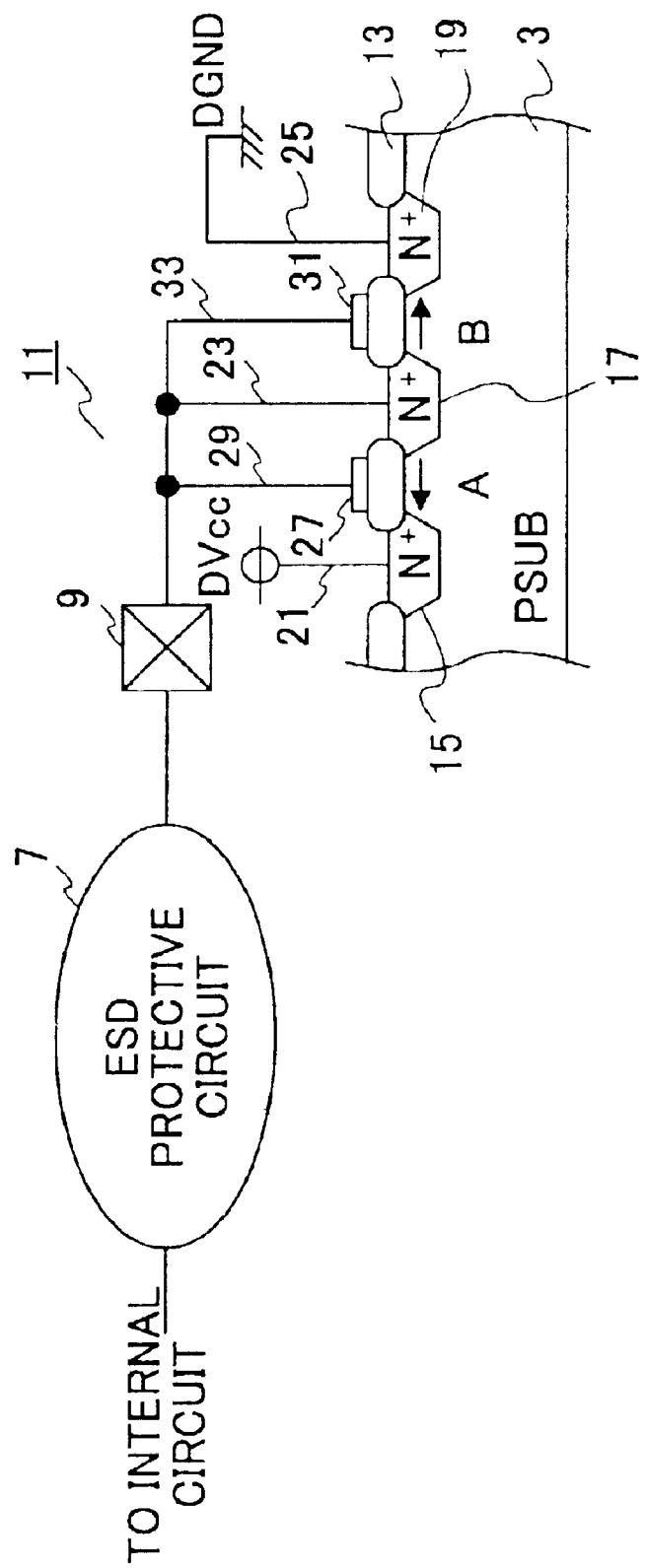
FIG. 1 is a cross-sectional view showing a semiconductor chip provided with an ESD protective circuit according to the first embodiment of the present invention.

The semiconductor apparatus according to the present invention may include a first metal wiring formed in said second portion of said semiconductor substrate, wherein said first metal wiring electrically connects the second diffusion regions of the plurality of outer ESD protective circuits to said higher voltage line of said main power supply, and a second metal wiring formed in said second portion of said semiconductor substrate, wherein said second metal wiring electrically connects the third diffusion regions of the plurality of outer ESD protective circuits to said lower voltage line of said main power supply.

As a result, the metal wiring makes it easy to connect the outer ESD protective circuits to the higher voltage line and the lower voltage line of the main power supply. Further, since the metal wiring can be disposed on the semiconductor substrate without crossing other wiring, the area required for the outer ESD protective circuit can be reduced.

The semiconductor apparatus according to the present invention may further include an oxide layer formed on a surface of said semiconductor substrate separating said first diffusion region from said second diffusion region and said first diffusion region from said third diffusion region, a first electrode formed on said oxide layer between said first diffusion region and said second diffusion region, and a second electrode formed on said oxide layer between said first diffusion region and said third diffusion region.

As a result, the outer ESD protective circuit can assure that discharge of the electrostatic noise because of a MOSFET structure using the channel in the semiconductor substrate or the well region of the semiconductor substrate just under the oxide layer separating diffusion regions.

In the semiconductor apparatus according to the present invention, it is preferable that said first diffusion region, said second diffusion region, and said third diffusion region are single-layered diffusion regions having a second conductivity type. As a result, the area required for the outer ESD protective circuit can be reduced.

The semiconductor apparatus according to the present invention may further include one or more extra outer ESD protective circuits corresponding to each external connection terminal formed in said second portion of said semiconductor substrate and a common well region in said semiconductor substrate or in an extra common well region separately formed around said second portion of said semiconductor substrate, the extra outer ESD protective circuits having substantially the same structure as the outer ESD protective circuit, wherein a second diffusion region of the extra outer ESD protective circuit is electrically connected to a higher voltage line of a power supply other than said main power supply, and a third diffusion region of the extra outer ESD protective circuit is electrically connected to a lower voltage line of said power supply other than said main power supply.

As a result, since electrical paths are established between a plurality of higher voltage lines and a plurality of lower voltage lines, the discharging of electrostatic noise for all of the external connection terminals can be achieved.

In the semiconductor apparatus according to the present invention, it is preferable that the lower voltage of at least two power supplies is the ground voltage level, and the outer ESD protective circuits corresponding to said at least two power supplies share the same third diffusion region electrically connected to the ground voltage level.

As a result, the area required for the outer ESD protective circuit can be reduced.

The semiconductor apparatus according to the present invention may include a plurality of inner ESD protective circuits on signal lines between said internal circuit and the plurality of external connection terminals, each inner ESD protective circuit being provided with a protective diode formed by a punch-through transistor having the same structure as a MOSFET formed in said internal circuit, wherein a drain of said punch-through transistor is electrically connected to the signal line and a gate and a source of said punch-through transistor are electrically connected to a higher voltage line of a power supply corresponding to the external connection terminal or said main power supply.

As a result, the ESD withstanding voltage of the semiconductor apparatus can be further improved.

Figure 2A:
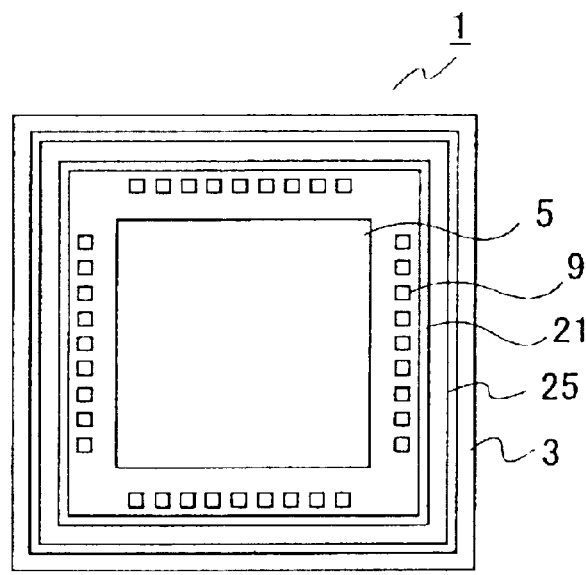
FIG. 2A is a top view showing the entire portion of the semiconductor chip provided with the ESD protective circuit showed in FIG. 1.
Figure 2B:
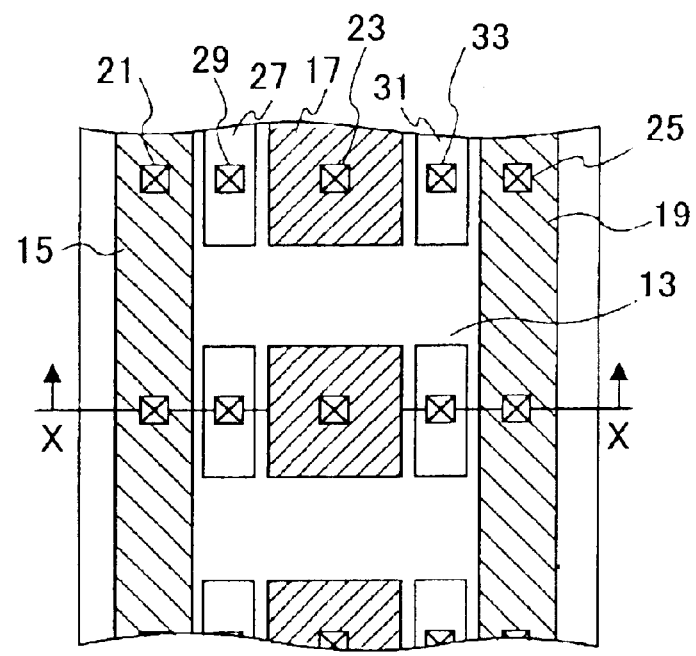
FIG. 2B is an enlarged partial top view of the ESD protective circuit of the semiconductor chip showed in FIG. 1.
Figure 3:
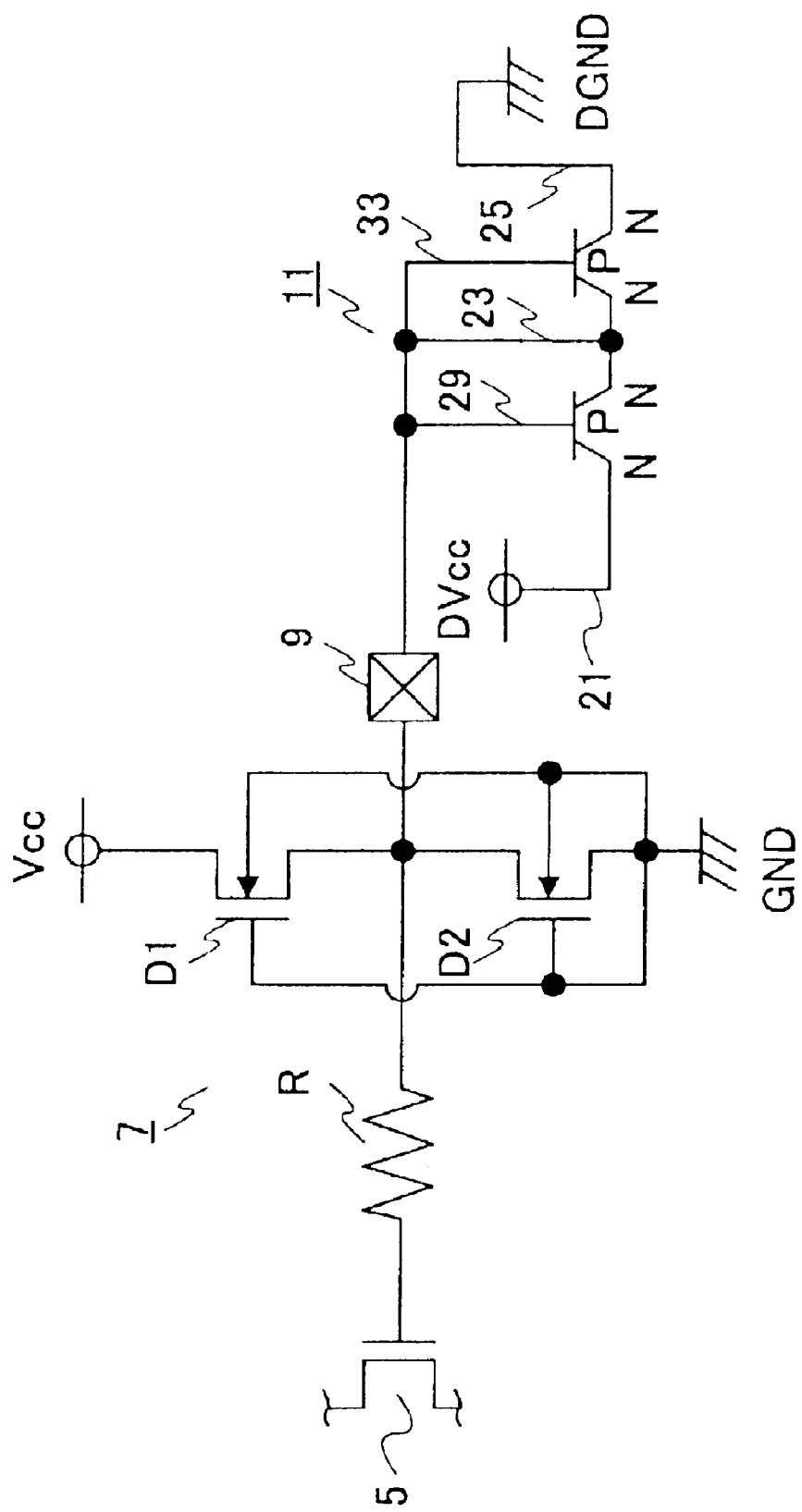
FIG. 3 is a circuit diagram of an equivalent circuit of the ESD protective circuit according to the first embodiment.

FIG. 1 is a cross-sectional view showing a semiconductor chip, of which a portion is showed as a block, provided with an ESD protective circuit according to the first embodiment of the present invention. FIG. 2A is a top view of the semiconductor chip showed in FIG. 1. FIG. 2B is a top view of the ESD protective circuit of the semiconductor chip showed in FIG. 1. FIG. 3 is a circuit diagram of an equivalent circuit of the ESD protective circuit according to the first embodiment. FIG. 1 is the cross-sectional view at the line X—X in FIG. 2B.

An internal circuit 5 is formed in the central portion of a semiconductor chip 1 made of a P-type semiconductor substrate 3, for example. A plurality of analog functional blocks and a plurality of digital functional blocks are formed in the internal circuit 5.

A plurality of pads (external connection terminals) 9 are formed in the peripheral portion of the semiconductor chip 1. The voltage levels applied to these pads 9 range between 0 and 7 volts (V). Depending on an analog functional block or a digital functional block of the internal circuit 5 electrically connected to each pad 9, the voltage level applied to the pad 9 differs.

An inner ESD protective circuit 7 is provided in the signal line between the inner circuit 5 and the pad 9. The inner ESD protective circuit is composed of two protective diodes D1 (high voltage side) and D2 (low voltage side) and a diffusion resistor R.

Both protective diodes D1 and D2 are punch-through transistors formed by N-channel type MOSFETs. The diffusion resistor R is provided in the signal line between the MOSFET 5d and the pad 9. The source of the protective diode D1 is connected to Vcc provided by either a digital power supply or an analog power supply. The drain of the protective diode D1 is connected to the drain of the protective diode D2 as well as the diffusion resistor R and the pad 9. The gates of the protective diodes D1 and D2, and the source of the protective diode D2 are connected to the ground.

In the outer region of the semiconductor chip 1 near the pad 9, an outer ESD protective circuit 11 is provided for each pad 9. The configuration of the outer ESD protective circuit 11 will be described in detail below.

N-type diffusion regions 15, 17, and 19 are formed on a P-type semiconductor substrate 3 of which density is $7.0 \times 10^{14}$ cm$^{-3}$, for example. The N-type diffusion regions 15, 17, and 19 are separated from each other by an oxide layer 13 450 nm thick. The density of the N-type diffusion regions 15, 17, and 19 is $1.0 \times 10^{21}$–$1.0 \times 10^{22}$ cm$^{-3}$, for example. The N-type diffusion regions 15, 17, and 19 are disposed in that order from the pad 9 side to the outer side of the semiconductor substrate. The distance between the N-type diffusion regions 15 and 17, and the distance between the N-type diffusion regions 17 and 19 are 1.2 µm, for example.

The N-type diffusion region 17 is electrically connected to the corresponding pad 9 through metal wiring. The N-type diffusion regions 17 of each outer ESD protective circuit 11 are separated from each other. The distance between 2 adjacent N-type diffusion regions 17 is 18.0 µm, for example.

All N-type diffusion regions 15 are continuous and form a stripe-shaped region in the outer side of the pad 9. The N-type diffusion regions 15 are electrically connected to the digital power supply DVcc through metal wirings 21 (first metal wirings) common to all outer ESD protective circuits 11.

All N-type diffusion regions 19 are also continuous and form a stripe-shaped region in the outer side of the N-type diffusion region 17. The N-type diffusion regions 19 are electrically connected to the digital ground DGND through metal wirings 25 (second metal wirings) common to all outer ESD protective circuits 11.

As showed in FIG. 2B, the N-type diffusion regions 15 and 19 form stripe-shaped regions along the arrangement of the pads 9. The N-type diffusion regions 15 and 19 of each outer ESD protective circuit 11 are connected to the metal wirings 21 and 25, respectively, through contacts.

In this embodiment, the digital power supply DVcc and the digital ground DGND provide the voltage level of the main power supply that provides power to the largest digital functional block in the internal circuit 5.

A gate electrode 27 is formed on the oxide layer 13 separating the N-type diffusion regions 15 and 17. The gate electrode 27 is electrically connected to the pad 9 through the metal wiring 29. Another gate electrode 31 is formed on the oxide layer 13 separating the N-type diffusion regions 17 and 19. The gate electrode 31 is electrically connected to the pad 9 through the metal wiring 33. The gate electrodes 27 and 31 may be made of metal or poly-silicon, for example.

The P-type semiconductor substrate 3, the N-type diffusion regions 15 and 17, the oxide layer 13, and the gate electrode 27 form a MOSFET structure, and the semiconductor substrate 3, the N-type diffusion regions 17 and 19, the oxide region 13, and the gate electrode 31 also form a MOSFET structure.

An inter-layer insulating film and an overcoat (not shown) are formed on the oxide layer 13, the N-type diffusion regions 15, 17, and 19, and the gate electrodes 29 and 31.

In this embodiment, an electrostatic noise coming from the pad 9 is transferred to the N-type diffusion region 17 and the gate electrodes 27 and 31 through the metal wirings 23, 29, and 33, respectively. The electrostatic charge in the gate electrode 27 generates a channel (as showed in FIG. 1 as an arrow "A") in a region of the P-type semiconductor substrate 3 just under the oxide layer 13 between the N-type diffusion regions 15 and 17, or the electrostatic charge in the gate electrode 31 generates a channel (as showed in FIG. 1 as an arrow "B") in a region of the P-type semiconductor substrate 3 just under the oxide layer 13 between the N-type diffusion regions 17 and 19. The electrostatic noise is discharged to either the digital power supply DVcc or the digital ground DGND, depending on which channel, A or B, is generated.

Since electrostatic noise is discharged through the digital power supply line DVcc or the digital ground line DGND, the electrostatic noise, even if it is applied to a pad 9 connected to an analog functional block, does not damage the internal circuit 5. The ESD withstanding voltage of the semiconductor apparatus 1 is improved significantly.

Additionally, the electrostatic noise is also discharged through the inner ESD protective circuit 7, and the ESD withstanding voltage of the semiconductor apparatus 1 is further improved.

Figure 5A:
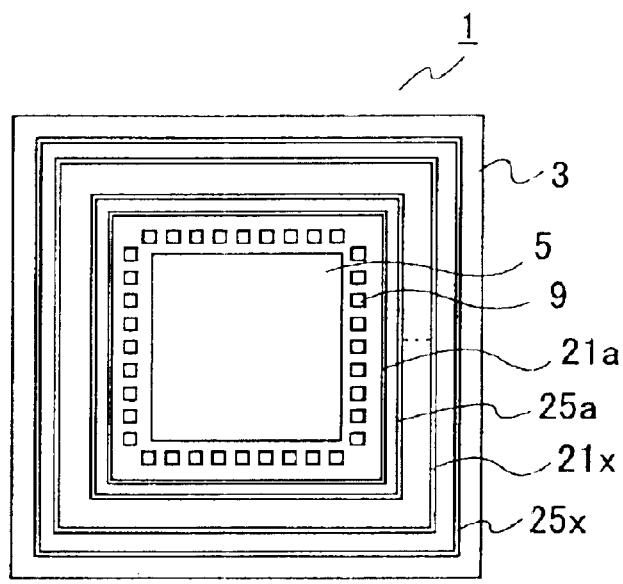
FIG. 5A is a top view of the semiconductor chip provided with the ESD protective circuit showed in FIG. 4.
Figure 5B:
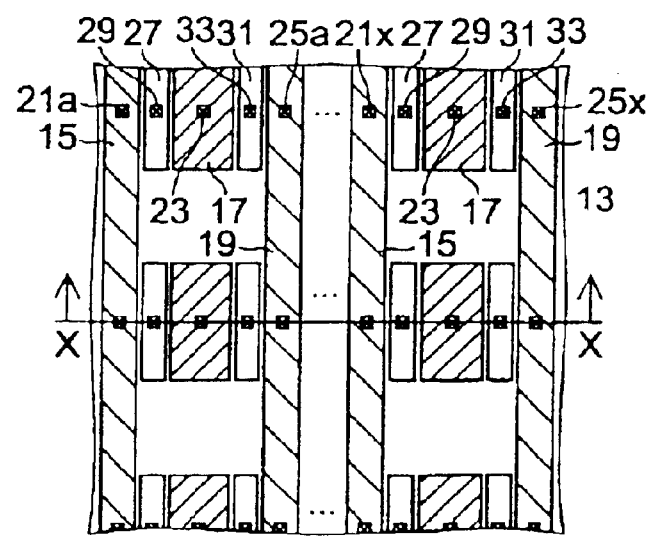
FIG. 5B is an enlarged partial top view of the ESD protective circuit of the semiconductor chip showed in FIG. 4.
Figure 6:
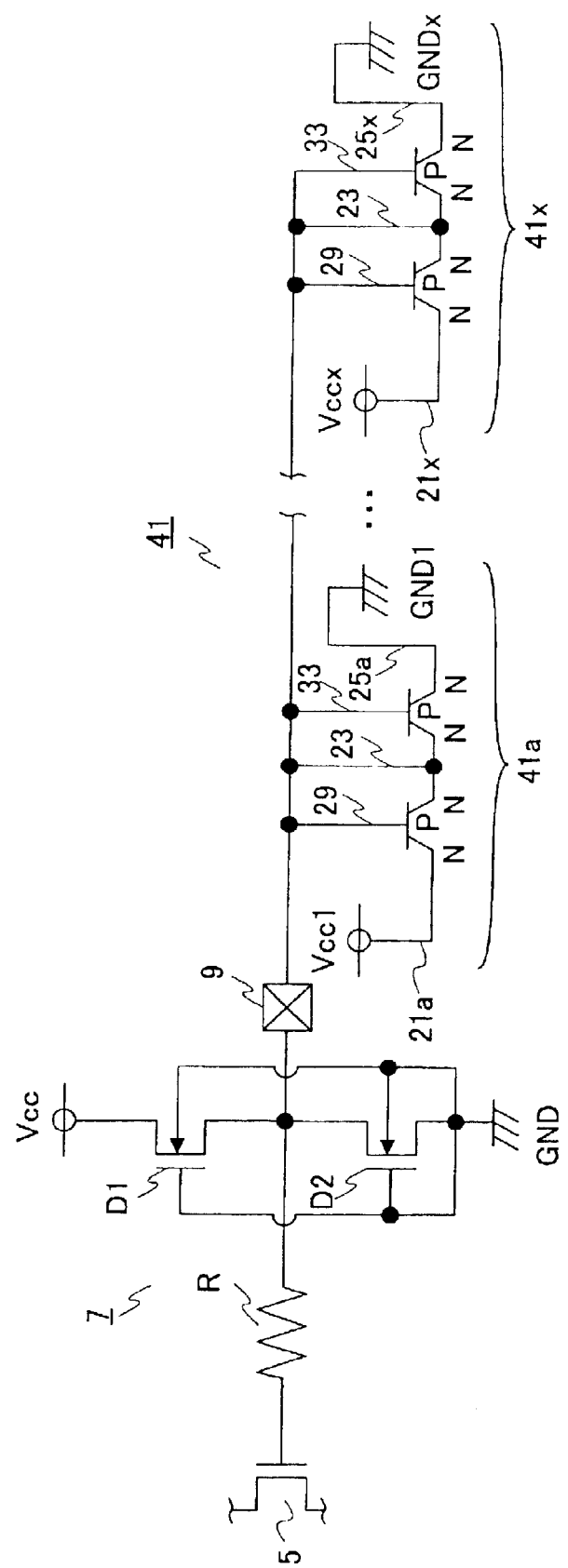
FIG. 6 is a circuit diagram of an equivalent circuit of the ESD protective circuit according to the second embodiment.

FIG. 4 is a cross-sectional view showing an ESD protective circuit according to the second embodiment of the present invention. FIG. 5A is a top view showing a semiconductor apparatus formed on a semiconductor substrate of P-type conductivity having the ESD protective circuit showed in FIG. 4, and FIG. 5B is a top view showing the ESD protective circuit showed in FIG. 4. FIG. 6 is a circuit diagram showing an equivalent circuit of the ESD protective circuit showed in FIG. 4. FIG. 4 is a cross-sectional view of the ESD protective circuit according to the second embodiment at the position of a line X—X of FIG. 5B. A component that is identical to one in FIGS. 1 through 3 is referred to by the same numeral and its description is omitted.

The semiconductor chip 1 made of a P-type semiconductor substrate 3, for example, has an internal circuit 5 at the center. A plurality of pads (external connection terminals) 9 are formed around the internal circuit 5. The pad 9 is electrically connected to an analog functional block or a digital functional block of the internal circuit 5, and a different voltage level is applied to the pad 9 depending on the functional block to which the pad 9 is connected. An inner ESD protective circuit 7 is provided on the signal line between the internal circuit 5 and the pad 9.

Outer ESD protective circuits 41 corresponding to the pads 9 are formed on the outside of the pads 9 of the semiconductor chip 1. The structure of the outer ESD protective circuit 41 will be described below.

The outer ESD protective circuit 41 includes a plurality of ESD protective circuits 41a, 41b, . . . , 41x correspondingly provided to the 1$^{st}$ power supply, the 2$^{nd}$ power supply, . . . , the x-th power supply, each outer ESD protective circuit having the same structure as the outer ESD protective circuit 11 showed in FIG. 1.

Each ESD protective circuit 41a, 41b, . . . , 41x has N-type diffusion regions 15, 17, 19 that are formed on the surface of the semiconductor substrate 3 and separated by the oxide layers 13. The N-type diffusion region 17 is electrically connected to a corresponding pad 9 through a metal wiring 23.

Each outer ESD protective circuit 41-a, 41b, . . . , 41x has gate electrodes 27, 31 and metal wiring 29, 33 formed on the oxide layers 13.

The N-type diffusion regions 15 of the outer ESD protective circuits 41a, 41b, . . . , 41x form a single continuous stripe-shaped region on the outside of the pads 9, and are electrically connected to the first power supply voltage Vcc1, the second power supply voltage Vcc2, . . . , the x-th power supply voltage Vccx, respectively, through common metal wiring 21a, 21b, . . . , 21x provided to the respective outer ESD protective circuit 41a, 41b, . . . , 41x.

The N-type diffusion regions 19 of the outer ESD protective circuts 41a, 41b, . . . , 41x form a single continuous stripe-shaped region on the outside of the pads 9, and are electrically connected to the first ground voltage GND1, the second ground voltage GND2, . . . , the x-th ground voltage GNDx, respectively, through common metal wiring 25a, 25b, . . . , 25x provided to the respective outer ESD protective circuit 41a, 41b, . . , 41x.

In this embodiment, the electrostatic noise from the pad 9 is transferred to the N-type diffusion region 17 and the gate electrodes 27, 31 through the metal wiring 23, 29, and 33. The gate electrode 27 forms a channel in the semiconductor substrate 3 just under the oxide layer 13 between the N-type diffusion regions 15 and 17. Accordingly, if the power supply voltage is common, the electrostatic noise is discharged to the power supply lines Vcc1, Vcc2, . . . , Vccx since the electrostatic noise flows as indicated by arrows $A^1$, $A^2$, . . . , $A^x$. If the ground voltage is common, the electrostatic noise is discharged to the ground lines GND1, GND2, . . . , GNDx since the electrostatic noise flows as indicated by arrows $B^1$, $B^2$, . . . , $B^x$.

As described above, the ESD protective circuit 41 according to this embodiment forms a plurality of electric paths to the power supply lines or the ground lines to discharge electrostatic noise coming from the external connection terminals 9.

Figure 7:
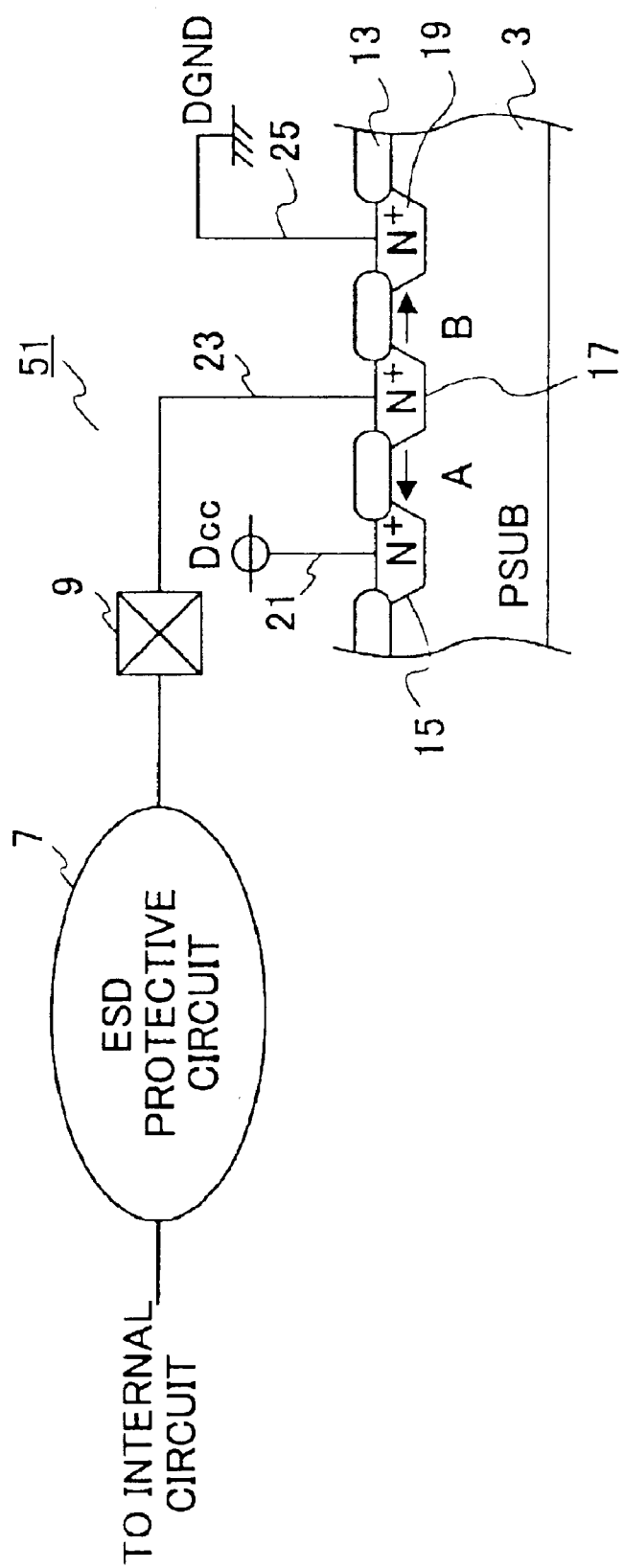
FIG. 7 is a cross-sectional view of a semiconductor chip provided with an ESD protective circuit according to the third embodiment of the present invention.

FIG. 7 is a cross-sectional view showing an ESD protective circuit 51 according to yet another embodiment (third embodiment) of the present invention. A component that is identical to one in FIG. 1 is referred to by the same numeral and its description is omitted.

The inner ESD protective circuit 7 is provided on the signal line between the internal circuit 5 and the pad 9. An outer ESD protective circuit 51 is provided to each pad 9 on the outside of the pad 9. The outer ESD protective circuit 51 includes N-type diffusion regions 15, 17, 19 separated by oxide layers 13. The N-type diffusion region 15 is electrically connected to the digital power supply line DVcc through a metal wiring 21. The N-type diffusion region 17 is electrically connected to the corresponding pad 9 through a metal wiring 23. The N-type diffusion region 19 is electrically connected to the digital ground line DGND through a metal wiring 25.

In this embodiment, an electrostatic noise from the pad 9 is transferred to the N-type diffusion region 17 through the metal wiring 23. If the electro static noise exceeds the junction ESD withstanding voltage of the P-type semiconductor substrate 3 and the N-type diffusion region 17, the electrostatic noise travels to the P-type semiconductor substrate.

If the power supply is common, the electro static noise traveling to the P-type semiconductor substrate 3 is discharged to the digital power supply line DVcc (showed as an arrow "A"). This is the same effect as the forming of a channel at the position of the arrow "A".

If the ground is common, the electrostatic noise traveling to the P-type semiconductor substrate 3 is discharged to the digital ground line DGND (showed as an arrow "B"). This is the same effect as the forming of a channel at the position of the arrow "B".

As described above, even if the ESD protective circuit 51 is not provided with a gate electrode, the electrostatic noise is discharged.

Figure 8:
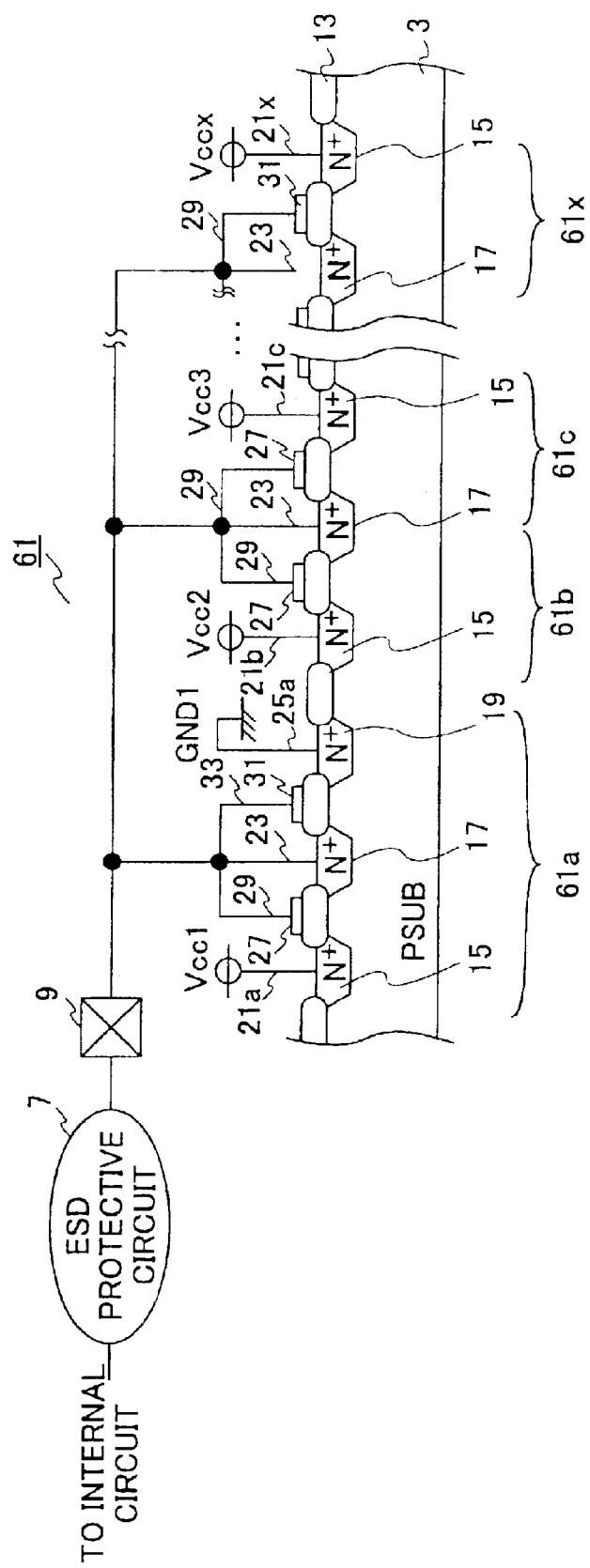
FIG. 8 is a cross-sectional view of a semiconductor chip provided with an ESD protective circuit according to the fourth embodiment of the present invention.
Figure 9:
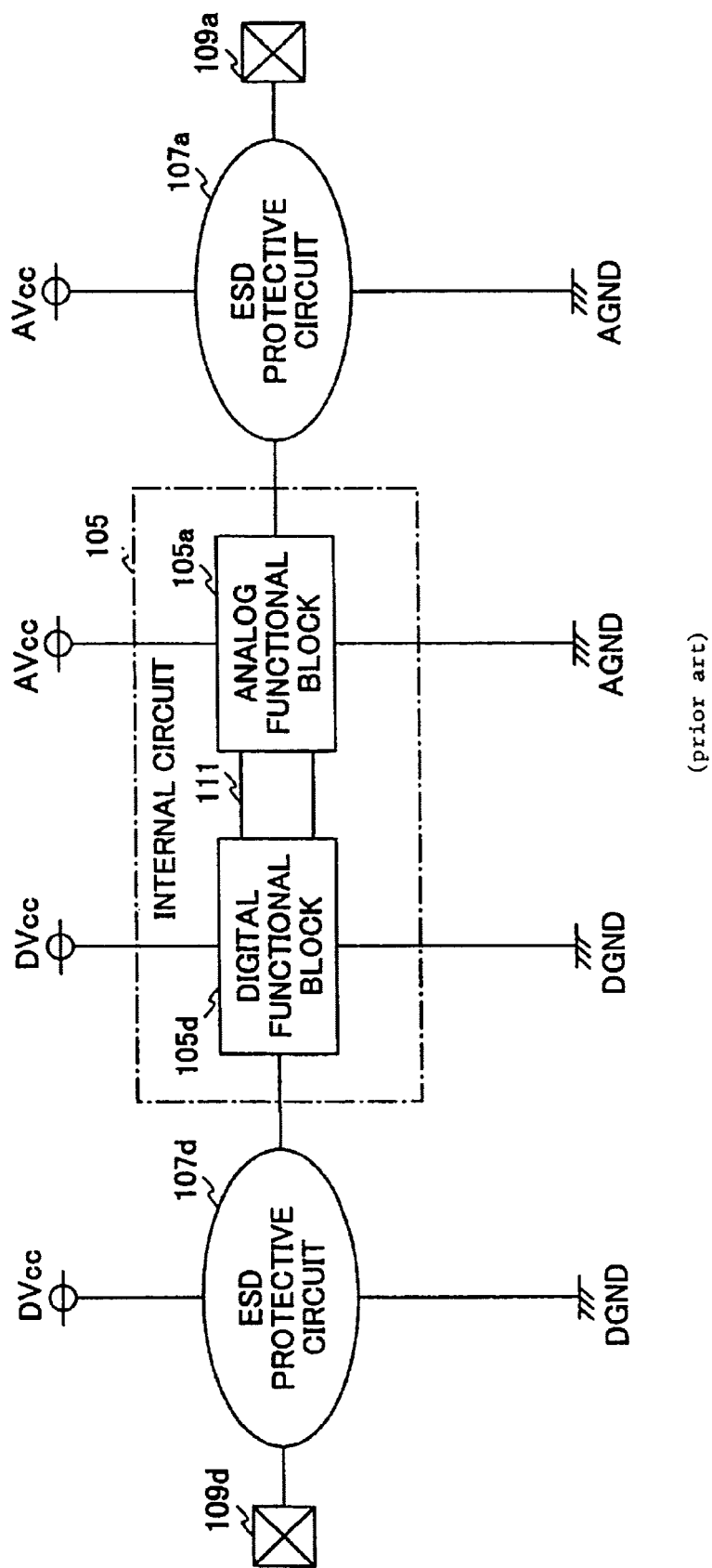
FIG. 9 is a block diagram showing a semiconductor apparatus having a conventional ESD protective circuit.
Figure 10:
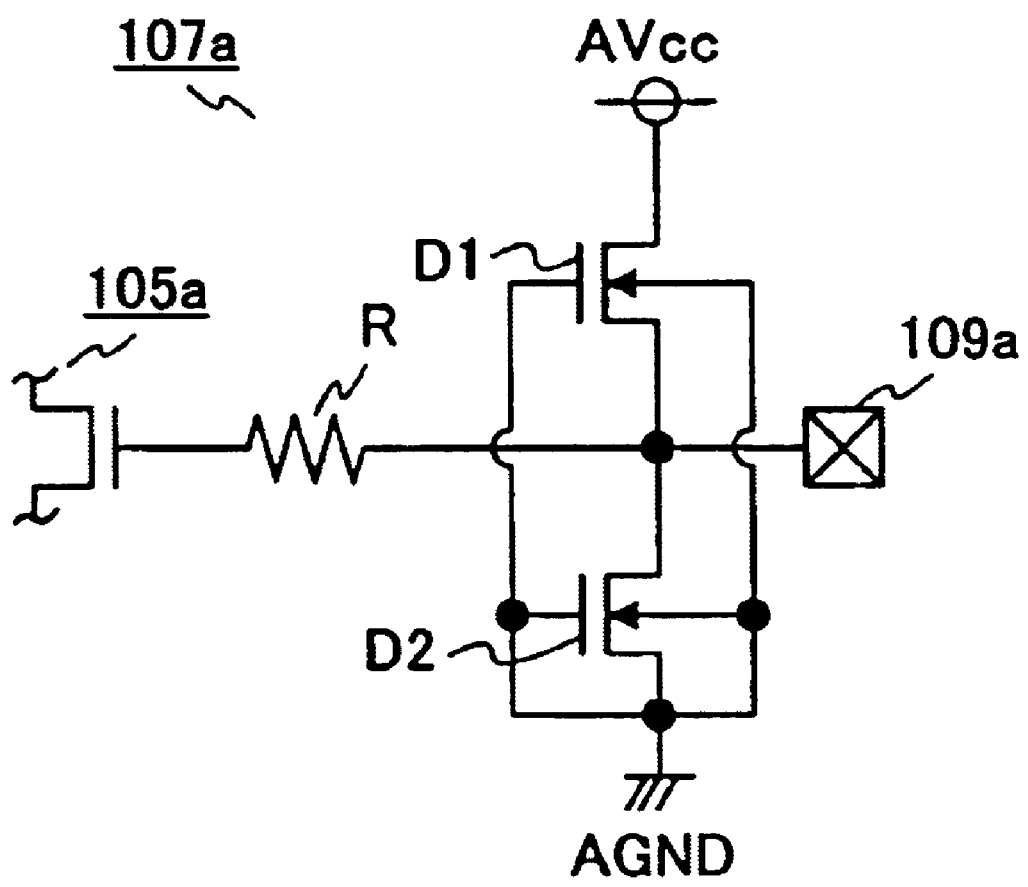
FIG. 10 is a circuit diagram of an equivalent circuit of the conventional ESD protective circuit.

FIG. 8 is a cross-sectional view showing an ESD protective circuit 61 according to yet another embodiment (fourth embodiment) of the present invention. A component that is identical to one in FIG. 4 is referred to by the same numeral and its description is omitted. This is a case wherein one of the multi-voltage levels is the ground level.

An inner ESD protective circuit 7 is provided on the signal line between the internal circuit 5 and the pad 9. An outer ESD protective circuit 61 is provided to each pad 9 on the outside of the pad 9. The outer ESD protective circuit 61 will be described below.

The outer ESD protective circuit 61 includes a plurality of ESD protective circuits 61a, 61b, . . . , 61x correspondingly provided to the 1$^{st}$ power supply, the 2$^{nd}$ power supply, . . . , the x-th power supply.

Compared to the structure of the ESD protective circuit 41a showed in FIG. 4, the structure of the ESD protective circuit 61a is the same. The GND1 is the ground level. The ESD protective circuits 61b, . . . , 61x respectively corresponding to the ESD protective circuits 41b, . . . , 41x of the outer ESD protective circuit 41 showed in FIG. 4 are not provided with the N-type diffusion region 19, the metal wiring 25b, . . . , 25x, and electrodes 31.

As described above, if at least two of the lower voltage lines of power supplies are the ground voltage or the same voltage level, the outer ESD protective circuits can share the same diffusion region to be connected to the lower voltage line. Accordingly, the area of the semiconductor chip can be reduced.

In the above embodiments, the N-type diffusion regions 15 and 19 form single continuous stripe-shaped regions, respectively. The N-type diffusion regions 15 and 19 of an outer ESD protective circuit corresponding to each pad, however, may be separate.

In the above embodiments, the outer ESD protective circuit is formed on a P-type semiconductor substrate. The outer ESD protective circuit may be formed in a P-type well formed in an N-type semiconductor substrate. The outer ESD protective circuit may be formed on an N-type semiconductor substrate or in an N-type well formed in a P-type semiconductor substrate. If the outer ESD protective circuit is formed on an N-type semiconductor substrate or an N-type well formed in a P-type semiconductor substrate, the diffusion region is required to be P-type. The diffusion region, whichever N-type or P-type, may be multi-layered instead of single layered.

The size, values, shape, and disposition described in the above embodiments are just examples. The present invention is not limited to these embodiments, but various variations and modifications may be made without departing from the scope of the present invention.

This patent application is based on Japanese priority patent application No. 2001-214111 filed on Jul. 13, 2001, the entire contents of which are hereby incorporated by reference.

What is claimed is:

1. A semiconductor apparatus formed on a semiconductor substrate having a first conductivity type, comprising:
    an internal circuit in the central portion of said semiconductor substrate;
    a plurality of external connection terminals formed in a first portion of said semiconductor substrate around said internal circuit, each external connection terminal being electrically connected to said internal circuit, wherein a plurality of power supplies correspondingly supply different voltage levels to the plurality of external connection terminals; and
    a plurality of outer ESD protective circuits formed in a second portion of said semiconductor substrate or a common well region in said semiconductor substrate, around said first portion of said semiconductor substrate;
    wherein each of said outer ESD protective circuits further comprises
    a first diffusion region electrically connected to one of the external connection terminals,
    a second diffusion region formed separately from said first diffusion region, said second diffusion region being electrically connected to a higher voltage line of a main power supply, and
    a third diffusion region formed separately from said first diffusion region, at a side of said first diffusion region opposite from said second diffusion region, said third diffusion region being electrically connected to a lower voltage line of said main power supply.

2. The semiconductor apparatus as claimed in claim 1, further comprising:
    a first metal wiring formed in said second portion of said semiconductor substrate, wherein said first metal wiring electrically connects the second diffusion region of the plurality of outer ESD protective circuits to said higher voltage line of said main power supply; and
    a second metal wiring formed in said second portion of said semiconductor substrate, wherein said second metal wiring electrically connects the third diffusion region of the plurality of outer ESD protective circuits to said lower voltage line of said main power supply.

3. The semiconductor apparatus claimed in claim 1, further comprising:
    an oxide layer formed on a surface of said semiconductor substrate separating said first diffusion region from said second diffusion region and said first diffusion region from said third diffusion region;
    a first electrode formed on said oxide layer between said first diffusion region and said second diffusion region; and
    a second electrode formed on said oxide layer between said first diffusion region and said third diffusion region.

4. The semiconductor apparatus as claimed in claim 1, wherein said first diffusion region, said second diffusion region, and said third diffusion region are single-layered diffusion regions having a second conductivity type.

5. The semiconductor apparatus as claimed in claim 1, further comprising:
    one or more extra outer ESD protective circuits corresponding to each external connection terminal formed in said second portion of said semiconductor substrate and said common well region in said semiconductor substrate or in an extra common well region separately formed around said second portion of said semiconductor substrate, the extra outer ESD protective circuits having substantially the same structure as the outer ESD protective circuit;
    wherein
    a second diffusion region of the extra outer ESD protective circuit is electrically connected to a higher voltage line of a power supply other than said main power supply; and
    a third diffusion region of the extra outer ESD protective circuit is electrically connected to a lower voltage line of said power supply other than said main power supply.

6. The semiconductor apparatus as claimed in claim 5, including a plurality of the extra outer ESD protective circuits corresponding to all power supplies.

7. The semiconductor apparatus as claimed in claim 5, wherein
    the lower voltage of at least two power supplies is the ground voltage level; and
    the extra outer ESD protective circuits corresponding to said at least two power supplies share the same third diffusion region electrically connected to the ground voltage level.

8. The semiconductor apparatus as claimed as claim 1, further comprising:
    a plurality of inner ESD protective circuits on signal lines between said internal circuit and the plurality of external connection terminals, each inner ESD protective circuit being provided with a protective diode formed by a punch-through transistor having the same structure as a MOSFET formed in said internal circuit, wherein a drain of said punch-through transistor is electrically connected to the signal line and a gate and a source of said punch-through transistor are electrically connected to a higher voltage line of a power supply corresponding to the external connection terminal or said main power supply.

* * * * *